(12) United States Patent
Judge et al.

(10) Patent No.: US 12,379,655 B2
(45) Date of Patent: Aug. 5, 2025

(54) CONTAMINANT IDENTIFICATION METROLOGY SYSTEM, LITHOGRAPHIC APPARATUS, AND METHODS THEREOF

(71) Applicant: ASML Holding N.V., Veldhoven (NL)

(72) Inventors: Andrew Judge, Monroe, CT (US); Ravi Chaitanya Kalluri, Bethel, CT (US); Michal Emanuel Pawlowski, Norwalk, CT (US); James Hamilton Walsh, Newtown, CT (US); Justin Lloyd Kreuzer, Trumbull, CT (US)

(73) Assignee: ASML Holding N.V., Veldhoven (NL)

( * ) Notice: Subject to any disclaimer, the term of this patent is extended or adjusted under 35 U.S.C. 154(b) by 30 days.

(21) Appl. No.: 17/918,426

(22) PCT Filed: Apr. 8, 2021

(86) PCT No.: PCT/EP2021/059243
§ 371 (c)(1),
(2) Date: Oct. 12, 2022

(87) PCT Pub. No.: WO2021/213813
PCT Pub. Date: Oct. 28, 2021

(65) Prior Publication Data
US 2023/0142459 A1    May 11, 2023

Related U.S. Application Data

(60) Provisional application No. 63/015,034, filed on Apr. 24, 2020.

(51) Int. Cl.
*G03F 1/84*     (2012.01)
*G01N 21/47*    (2006.01)
(Continued)

(52) U.S. Cl.
CPC ........... *G03F 1/84* (2013.01); *G01N 21/4795* (2013.01); *G01N 21/8806* (2013.01);
(Continued)

(58) Field of Classification Search
CPC ..... G03F 1/84; G03F 7/2004; G01N 21/4795; G01N 21/8806; G01N 21/8851; G01N 21/94; G01N 21/9501; G01N 2021/8896
See application file for complete search history.

(56) References Cited

U.S. PATENT DOCUMENTS 5,506,616 A * 4/1996 Scheps ............... G01N 21/8806
                                                           348/31
6,266,137 B1   7/2001 Morinaga
(Continued)

FOREIGN PATENT DOCUMENTS

DE    102015201139 A1   4/2015
TW    2013-37246 A      9/2013

OTHER PUBLICATIONS

Sullenberger et al Spatially-resolved individual particle spectroscopy using photothermal modulation of Mie scattering, Optics Letters, vol. 42, No. 2, Jan. 15, 2017; pp. 203-206 (Year: 2017).*

(Continued)

*Primary Examiner* — Kara E. Geisel
*Assistant Examiner* — Jonathon Cook
(74) *Attorney, Agent, or Firm* — Sterne, Kessler, Goldstein & Fox P.L.L.C.

(57) ABSTRACT

An inspection system (1600), a lithography apparatus, and an inspection method are provided. The inspection system (1600) includes an illumination system (1602), a detection system (1606), and processing circuitry (1622). The illumination system generates a first illumination beam (1610) at a first wavelength and a second illumination beam (1618) at a second wavelength. The first wavelength is different from (Continued)

the second wavelength. The illumination system irradiates an object (1612) simultaneously with the first illumination beam and the second illumination beam. The detection system receives radiation (1620) scattered by a particle (1624) present at a surface (1626) of the object at the first wavelength. The detection system generates a detection signal. The processing circuitry determines a characteristic of the particle based on the detection signal.

17 Claims, 18 Drawing Sheets

(51) Int. Cl.
  *G01N 21/88* (2006.01)
  *G01N 21/94* (2006.01)
  *G03F 7/20* (2006.01)
(52) U.S. Cl.
  CPC ......... *G01N 21/8851* (2013.01); *G01N 21/94* (2013.01); *G03F 7/2004* (2013.01); *G01N 2021/8896* (2013.01)

(56) References Cited

U.S. PATENT DOCUMENTS

| | | | |
|---|---|---|---|
| 7,511,799 B2 | 3/2009 | Tel et al. | |
| 2002/0154295 A1* | 10/2002 | Ivakhnenko | G01N 15/0211 356/237.2 |
| 2004/0207836 A1 | 10/2004 | Chhibber et al. | |
| 2006/0181700 A1* | 8/2006 | Andrews | G01N 21/4738 356/237.2 |
| 2007/0002317 A1* | 1/2007 | Yang | G01N 21/4738 356/237.2 |
| 2008/0225286 A1 | 9/2008 | Shibata et al. | |
| 2010/0045955 A1* | 2/2010 | Vladimirsky | G03F 7/70916 348/86 |
| 2010/0271626 A1 | 10/2010 | Horai et al. | |
| 2014/0146297 A1* | 5/2014 | Vainer | G03F 1/84 250/226 |
| 2015/0062570 A1* | 3/2015 | Suzuki | G03F 7/00 356/237.4 |
| 2018/0188188 A1* | 7/2018 | Zhao | G01N 21/9501 |
| 2019/0212277 A1 | 7/2019 | Zhao et al. | |
| 2021/0010949 A1* | 1/2021 | Xu | G01N 21/45 |
| 2023/0106481 A1* | 4/2023 | Pawlowski | G03F 1/84 |
| 2023/0175982 A1* | 6/2023 | Honda | G01N 21/8851 356/446 |

OTHER PUBLICATIONS

Spatially-resolved individual particle spectroscopy using photothermal modulation of Mie scattering, Optics Letters, vol. 42, No. 2, Jan. 15, 2017; pp. 203-206 (Year: 2017).*

Photothermal Microscopy: Imaging the Optical Absorption of Single Nanoparticles and Single Molecules, Subhasis Adhikari, Patrick Spaeth, Ashish Kar, Martin Dieter Baaske, Saumyakanti Khatua, and Michel Orrit, ACS Nano 2020 14 (12), 16414-16445, DOI: 10.1021/acsnano.0c07638 (Year: 2020).*

International Search Report and Written Opinion of the International Searching Authority directed to related International Patent Application No. PCT/EP2021/059243, mailed Jul. 13, 2021; 13 pages.

Sullenberger et al., "Spatially-resolved individual particle spectroscopy using photothermal modulation of Mie scattering," Optics Letters, vol. 42, No. 2, Jan. 15, 2017; pp. 203-206.

Taiwanese Notice of Review Opinion directed to Taiwanese Patent Application No. 110113721, mailed Nov. 5, 2024; 24 pages.

* cited by examiner

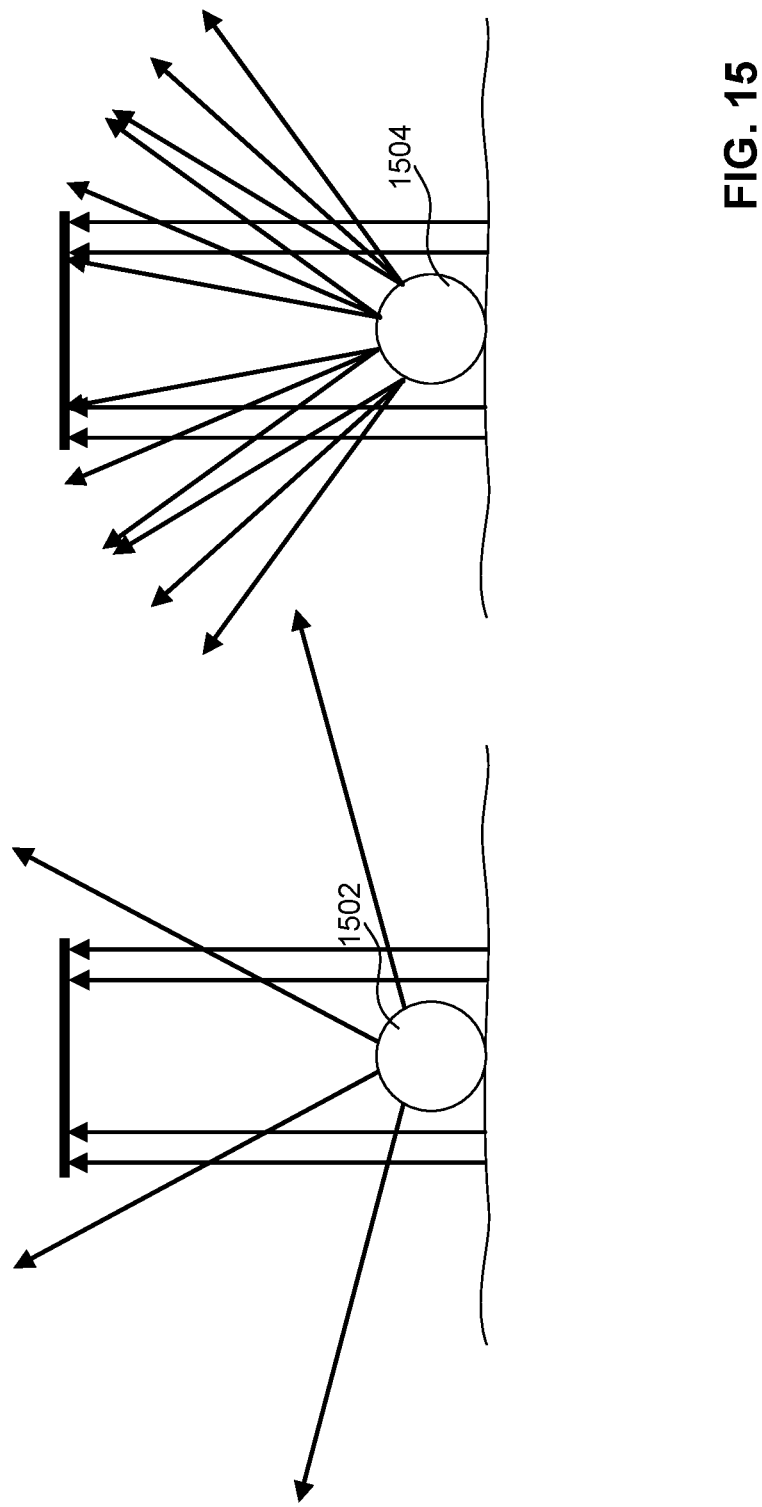

CONTAMINANT IDENTIFICATION METROLOGY SYSTEM, LITHOGRAPHIC APPARATUS, AND METHODS THEREOF

CROSS-REFERENCE TO RELATED APPLICATIONS

This application claims priority of U.S. Provisional Patent Application No. 63/015,034, which was filed on Apr. 24, 2020, and which is incorporated herein in its entirety by reference.

FIELD

The present disclosure relates to lithographic systems, for example, inspection systems for detecting contaminants on a reticle in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

During lithographic operation, different processing steps may require different layers to be sequentially formed on the substrate. Sequencing of layers is typically accomplished by exchanging different reticles, according to the desired pattern for each layer, for each pattern transfer process.

A typical lithographic system works within sub-nanometer tolerances regarding patterns on the reticle and patterns transferred onto the wafer from the reticle. Within the environment of the lithographic apparatus, highly dynamic processes take place, e.g., reticle hand-off, wafer hand-off, controlled gas flows, outgassing of vacuum chamber walls, liquid dispensing (e.g., photoresist coating), temperature variations, metal deposition, rapid movement of numerous actuatable components, and wear of structures. Over time, dynamic processes introduce and build up contaminant particles within the lithographic apparatus. A contaminant particle on a reticle may introduce errors to transferred patterns. Therefore, it is desirable to maintain contaminant-free reticles capable of accurately transferring patterns onto wafers with sub-nanometer accuracy while minimizing false positive detection.

SUMMARY

There is a need to provide improved inspection techniques to detect contaminants on optically critical components of a lithographic apparatus.

In some embodiments, a system comprises an illumination system, a detection system, and processing circuitry. The illumination system generates a first illumination beam at a first wavelength and a second illumination beam at a second wavelength. The first wavelength is different from the second wavelength. The illumination system irradiates an object simultaneously with the first illumination beam and the second illumination beam. The detection system receives radiation scattered by a particle present at a surface of the object at the first wavelength. The detection system generates a detection signal. The processing circuitry determines a characteristic of the particle based on the detection signal.

In some embodiments, a method comprises irradiating an object simultaneously with a first illumination beam at a first wavelength and a second illumination beam at a second wavelength. The first wavelength is different from the second wavelength. The method also comprises receiving scattered radiation by a particle present at a surface of the object at the first wavelength; generating a detection signal based on the received scattered radiation; analyzing the detection signal; and determining a characteristic of the particle based on the detection signal.

In some embodiments, a lithographic apparatus comprises an illumination apparatus, a projection system, and a metrology system. The metrology system comprises an illumination system, a detection system, and a processor. The illumination system generates a first illumination beam at a first wavelength and a second illumination beam at a second wavelength. The first wavelength is different from the second wavelength. The illumination system irradiates an object simultaneously with the first illumination beam and the second illumination beam. The detection system receives radiation scattered by a particle present at a surface of the object at the first wavelength. The detection system generates a detection signal. The processing circuitry determines a characteristic of the particle based on the detection signal.

Further features of the present disclosure, as well as the structure and operation of various embodiments, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

FIG. 15 shows exemplary reflections from different particle types, according to some embodiments.

Figure 1A:
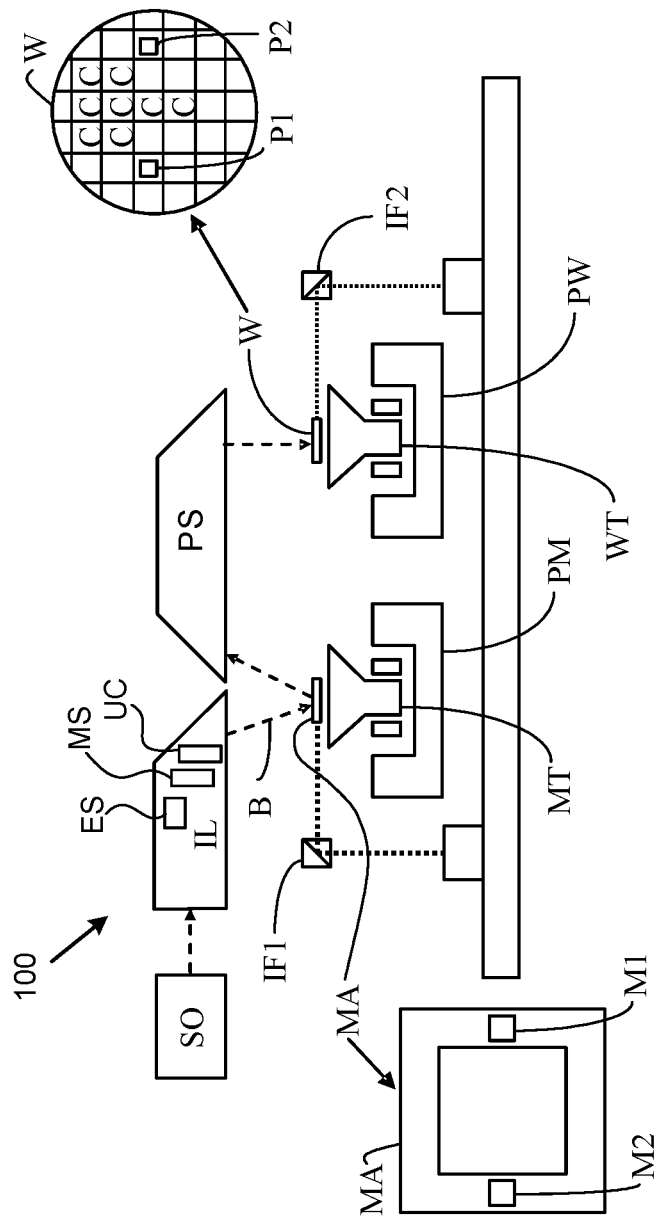
FIG. 1A shows a schematic of a reflective lithographic apparatus, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc. The term "non-transitory" may be used herein to characterize computer readable media used for storing data, information, instructions, and the like, with the sole exception being a transitory, propagating signal.

Before describing such embodiments in more detail, however, it is instructive to present an example environment in which embodiments of the present disclosure can be implemented.

Example Lithographic Systems

Figure 1B:
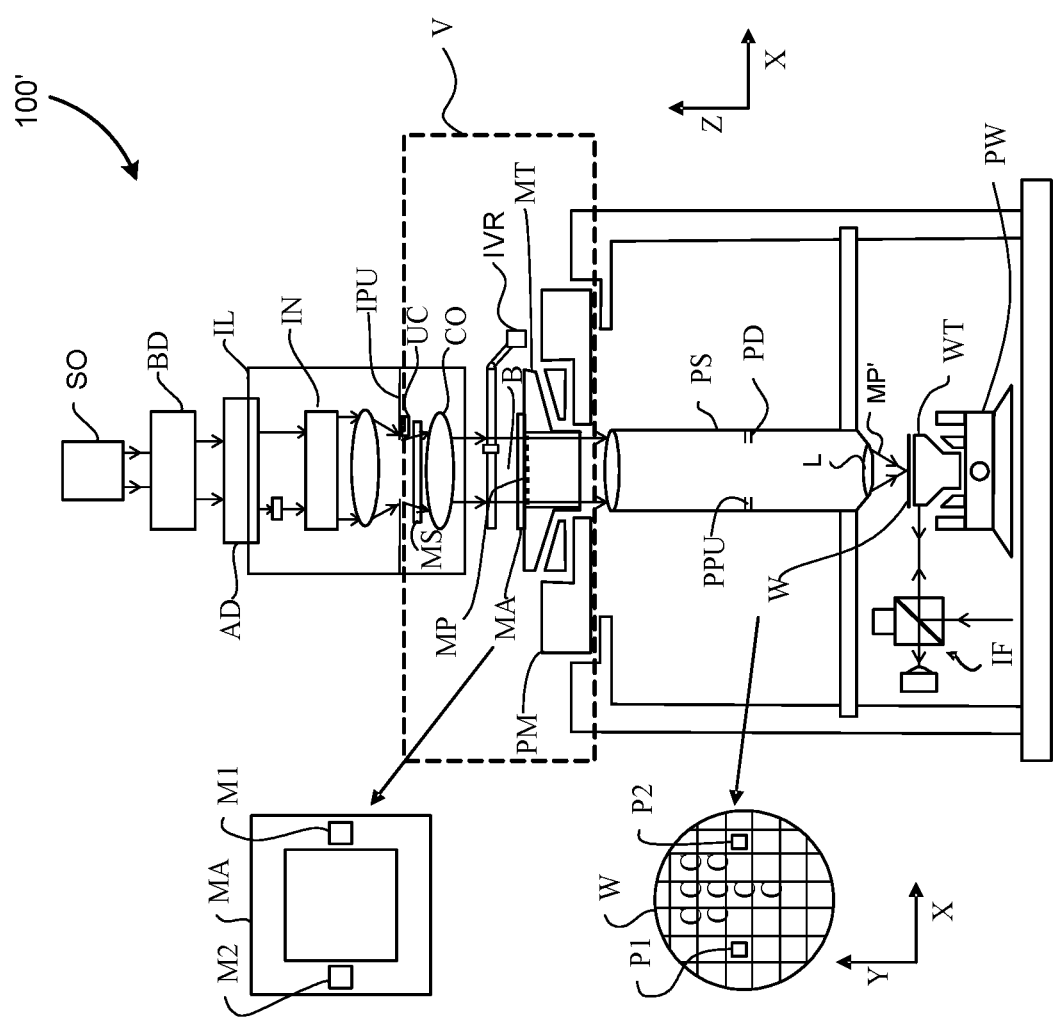
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT may be a frame or a table, for example, which may be fixed or movable, as required. By using sensors, the support structure MT may ensure that the patterning device MA is at a desired position, for example, with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B, which is reflected by a matrix of small mirrors.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables WT (and/or two or more mask tables). In such "multiple stage" machines, the additional substrate tables WT may be used in parallel, or preparatory steps may be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' may be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO may be an integral part of the lithographic apparatus 100, 100', for example, when the source SO is a mercury lamp. The source SO and the illuminator IL, together with the beam delivery system BD, if required, may be referred to as a radiation system.

The illuminator IL may include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator may be adjusted. In addition, the illuminator IL may comprise various other components (in FIG. 1B), such as an integrator IN and a condenser CO. The illuminator IL may be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT may be moved accurately (for example, so as to position different target portions C in the path of the radiation beam B). Similarly, the first positioner PM and another position sensor IF1 may be used to accurately position the patterning device (for example, mask) MA with respect to the path of the radiation beam B. Patterning device (for example, mask) MA and substrate W may be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU. Further, in some embodiments, astigmatism aberration may be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT may be moved accurately (for example, so as to position different target portions C in the path of the radiation beam B). Similarly, the first positioner PM and another position sensor (not shown in FIG. 1B) may be used to accurately position the mask MA with respect to the path of the radiation beam B (for example, after mechanical retrieval from a mask library or during a scan).

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only or may be fixed. Mask MA and substrate W may be aligned using mask alignment marks M1, M2, and substrate alignment marks P1, P2. Although the substrate alignment marks (as illustrated) occupy dedicated target portions, they may be located in spaces between target portions (known as scribe-lane alignment marks). Similarly, in situations in which more than one die is provided on the mask MA, the mask alignment marks may be located between the dies.

Mask table MT and patterning device MA may be in a vacuum chamber V, where an in-vacuum robot IVR may be used to move patterning devices such as a mask in and out of vacuum chamber. Alternatively, when mask table MT and patterning device MA are outside of the vacuum chamber, an out-of-vacuum robot may be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' may be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT may be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes a programmable patterning device, such as a programmable mirror array.

Combinations and/or variations on the described modes of use or entirely different modes of use may also be employed.

In some embodiments, a lithographic apparatus may generate DUV and/or EUV radiation. For example, lithographic apparatus 100' may be configured to operate using a DUV source. In another example, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
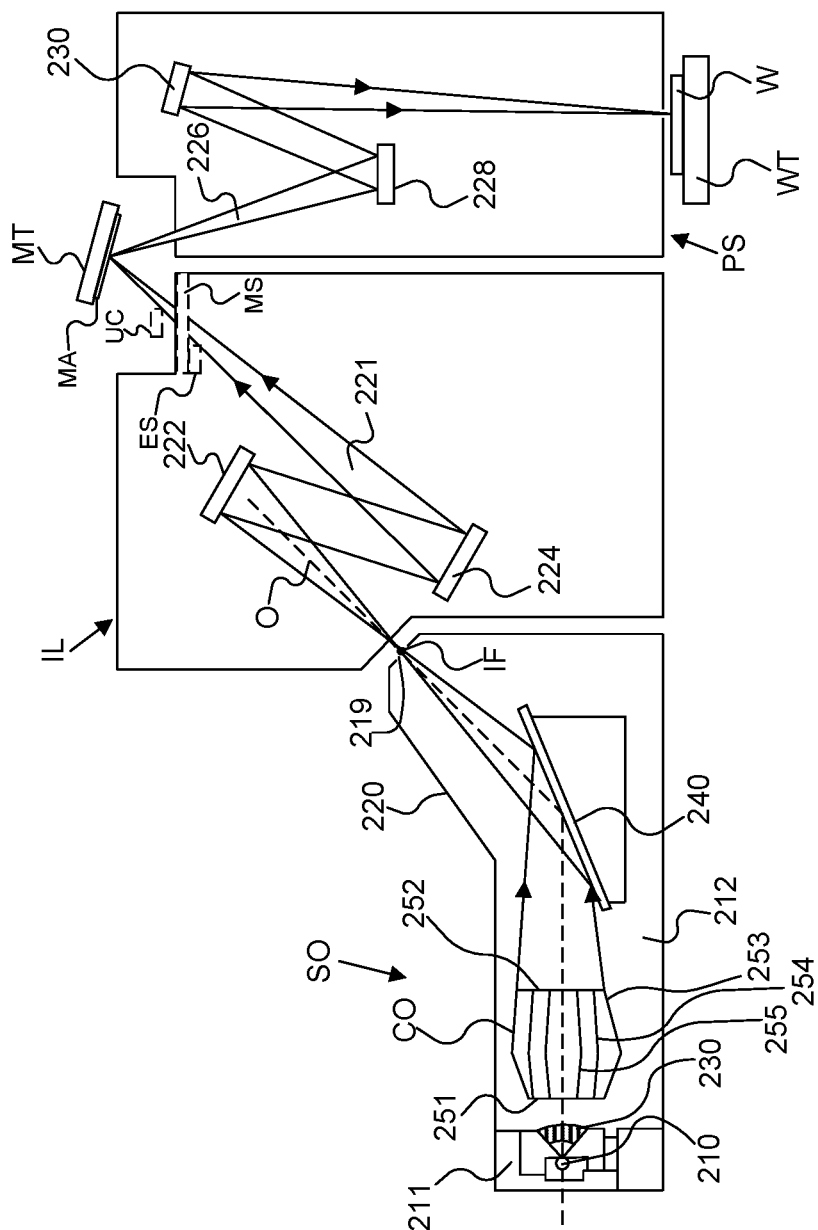
FIG. 2 shows a more detailed schematic of the reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment may be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor may be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO, which may be a so-called grazing incidence collector. Radiation collector CO has an upstream radiation collector side 251 and a downstream radiation collector side 252. Radiation that traverses collector CO may be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
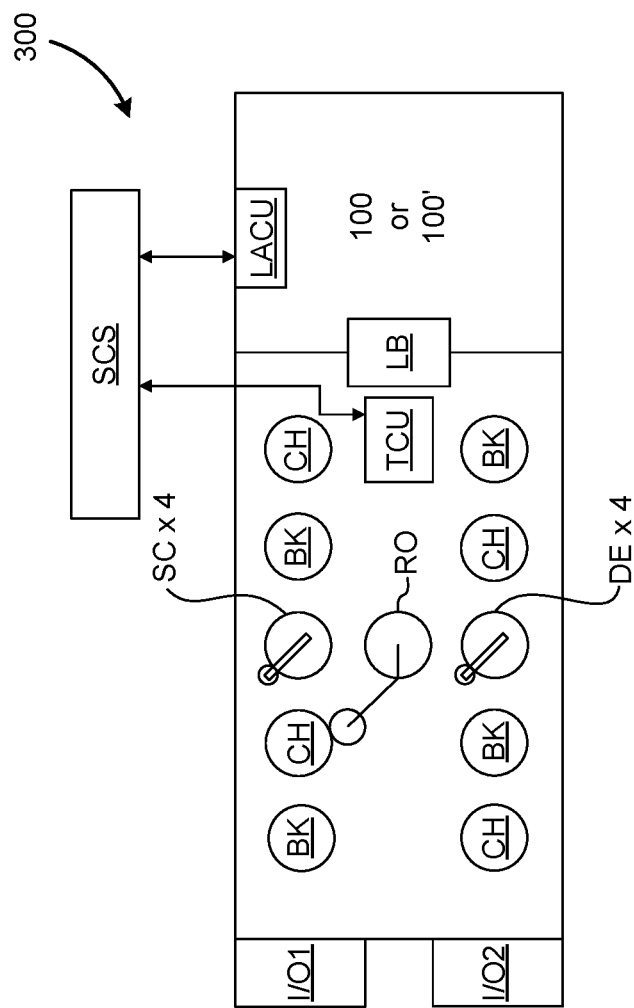
FIG. 3 shows a schematic of a lithographic cell, according to some embodiments.

FIG. 3 shows a lithographic cell 300, also sometimes referred to a lithocell or cluster, according to some embodiments. Lithographic apparatus 100 or 100' may form part of lithographic cell 300.

Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses may be operated to maximize throughput and processing efficiency.

Exemplary Contaminant Inspection Apparatus

In some embodiments, a metrology system may be used to inspect an object in order to determine a cleanliness of the object. Inspection techniques may be performed such that undesirable defects on a surface (e.g., a surface of a reticle or substrate) are successfully detected while minimizing false detections (or false positives). Inspection techniques may comprise optical inspection.

The term "imperfection," "defect," "blemish," and the like may be used herein to refer to deviations or non-uniformities of structures from a specified tolerance. For example, a flat surface may have defects such as scratches, holes, or recesses, foreign particles, stains, and the like.

In the context of imperfections, the terms "foreign particle," "contaminant particle," "contaminant," and the like may be used herein to refer to unexpected, atypical, undesirable, or the like (herein undesirable) particulate matter that is present in a region or on a surface that was not designed to tolerate the presence of the undesirable particulate matter or otherwise adversely impacts operation of the apparatus on which the particulate matter is present. Some examples of foreign particles may include dust, stray photoresist, or other dislodged materials within the lithographic apparatus. Examples of dislodged materials may include steel, Au, Ag, Al, Cu, Pd, Pt, Ti, and the like. Material dislodging may occur due to, e.g., processes of fabricating metal interconnects on substrates and friction and impacts of actuated structures. Contaminants may make their way onto sensitive parts in the lithographic apparatus (e.g., reticle or substrate) and increase the likelihood of errors in lithographic processes. Embodiments of the present disclosure provide structures and functions for detecting defects on sensitive parts of a lithographic apparatus or process.

Most image based algorithms operate on single image and series of morphological operations are performed in order to distinguish target objects, e.g.: particles from surrounding background. Typically geometrical features of object(s) are measured taking certain assumptions regarding ratio of intensity between object and background and some models of target object edges are taken into account while developing analysis algorithms. Most commonly utilized model assumes gaussian like transition of intensity between target object and surrounding neighborhood. Commonly intensity level equals to full width half maximum (FWHM) (intensity of target as compared to background) is used to isolate objects. These can lead to fairly simple data processing routines, which may utilize arbitrary pre-set intensity threshold level to binarize image, followed by series of morphological operations to identify objects of interest. Simplicity of this approach comes with significant drawbacks. In order to guarantee detection at required probability level and sizing at requested accuracy and probability, scene S/N ratio together with background noise level must meet certain criteria. Additionally, typically analyzed images must meet quality criteria, such as background uniformity and target object visibility, which are commonly assumed to be constant across the image. These assumptions are hard to meet in practice as BRDF (Bi-directional Reflectance Distribution Function) functions of measured targets are typically non-uniform and as a result, brightness of target(s) changes with illumination direction, orientation, and distance to imaging system.

Particle detection and sizing plays important role in test and measurement equipment installed on lithographic machines. Currently used systems (e.g., reticle backside inspection (RBI), integrated reticle inspection system (IRIS)), from functional perspective, are essentially image based scatterometers. Scatterometry systems or scatterometers provide information on a particle's location and size. Scatterometers size particles based on energy reflected by a target into a direction of a detection system. Scatterometers are fairly simple in terms of their opto-mechanical layout and data analysis is essentially reduced to analysis of intensity signal which is proportional to a particle area. While instruments operating based on this principle are fairly simple, they come with several disadvantages, mainly:

Sizing of particles based on returned intensity is limited to particles having a size smaller than spatial resolution of detection system.

Scattering properties of particles are material and surface profile dependent. Hence, particles made from dissimilar materials and/or having different surface optical properties can be incorrectly sized as described further below.

Scatterometers do not provide information about a material composition of the particle.

Scatterometers typically utilize a calibration curve which provides direct conversion between intensity and physical size of particles measured usually for reference type of target such as PSL (polystyrene-latex sphere). Thus, a size of particle reported by a scatterometer should be interpreted as the size of equivalent PSL rather than physical size of particle of interest. Thus, particles of different material than the calibration standard with different reflectivity cause different light intensity, leading to an inaccurate reading of size.

Further, false positives are detrimental to lithography. For example, a false positive detection may slow down production by unnecessarily prompting a maintenance action (e.g., reticle replacement) or even recommending discarding a perfectly conforming reticle. Several solutions are under consideration in the industry to improve the precision and accuracy of particle size measurement, however, such solutions (e.g., multi direction illumination, multi imaging techniques involving polarization) may not provide sufficient attenuation of false positive rate since patterns printed on a reticle are not known.

In order to overcome the above described limitations, particle detection/measurement systems described herein employ a high-resolution imaging system and measure particles size based on surface of area of images of a particle. Hence, the system described herein provides sizing accuracy comparable to microscope systems. Accuracy is directly related to imaging system properties. Further, embodiments of the present disclosure provide structures and functions for reducing instances or eliminating false positives. Embodiments of the present disclosure provide a material composition (type) of the particle.

Figure 4:
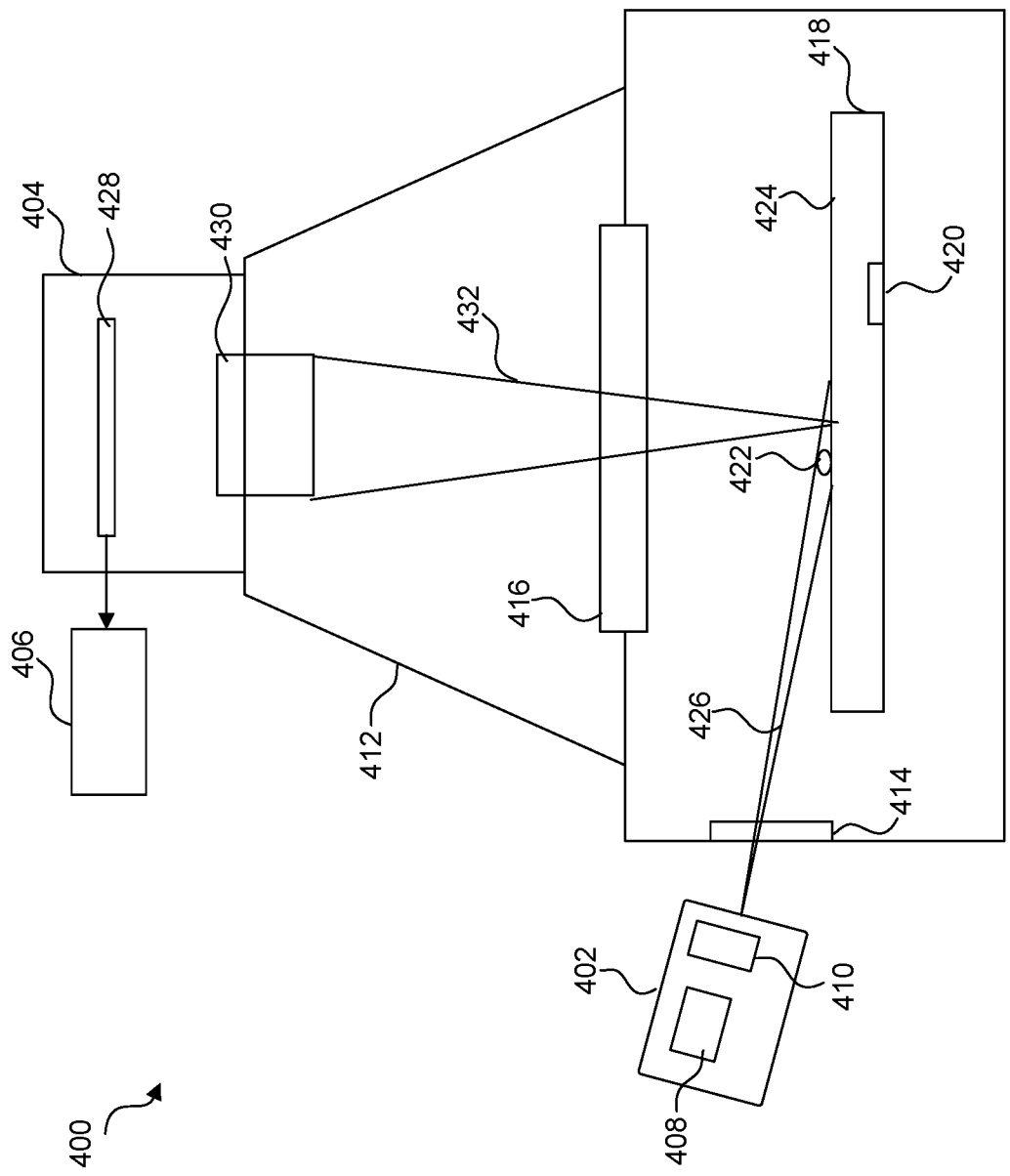
FIG. 4 shows a schematic of a particle inspection system, according to some embodiments.

FIG. 4 shows a schematic of a particle inspection system 400, according to some embodiments. In some embodiments, particle inspection system 400 may be implemented in a lithographic apparatus. Particle inspection system 400 may comprise an illumination system 402, a detection system 404, and a processor 406. Illumination system 402 may comprise a radiation source 408. Illumination system 402 may comprise one or more radiation adjusting elements 410 (e.g., any of polarizers, wavelength filters, focusing elements, beam splitters, beam combiners, and the like).

Particle inspection system 400 may comprise an enclosure 412. Enclosure 412 may comprise one or more compartments. Enclosure 412 may comprise viewport windows 414 and 416.

Before describing embodiments of particle inspection system 400 in more detail, however, it is instructive to present examples of an object that may be inspected using the particle inspection system 400. In some embodiments, object 418 may be a reticle. Reticle may comprise pattern features 420. Pattern features 420 may comprise, for example, product and alignment mark patterns to be transferred onto a substrate via a lithographic process. A foreign particle 422 on surface 424 of object 418 may negatively impact lithography, since a foreign particle may print through or otherwise distort a shape of object 418 when the foreign particle is sandwiched between object 418 and a reticle table, or cause damage to the reticle or reticle table surfaces when sandwiched between them, or transfer to the reticle table and thus contaminate it and potentially contaminate or damage other reticles loaded on the same stage. In one example, particle 422 may have a diameter in a range from 5 µm to 200 µm.

In some embodiments, radiation source 408 may generate a beam of radiation 426 or more than one of beam of radiation 426 to illuminate object 418. Beam of radiation 426 may comprise a first beam of radiation at a first wavelength and a second beam of radiation at a second wavelength that is different from the first wavelength. Radiation source 408 may include one or more radiation sources. For example, radiation source 408 may include a first radiation source configured to generate a beam of radiation at first wavelength and a second radiation source configured to generate a beam of radiation at a second wavelength. In some embodiments, the radiation source 408 may be a tunable radiation source configured to generate a beam of radiation at first wavelength and at second wavelength. The radiation generated by radiation source 408 may be coherent radiation. For example, radiation source 408 may be one or more laser diodes. Radiation source 408 may illuminate object 418 with the first beam of radiation and the second beam of radiation simultaneously or subsequently.

In one example, the first beam of radiation and the second beam of radiation may be generated using a single radiation source. One or more radiation adjusting elements 410 (e.g., wavelength filters) may be used to select wavelengths to be used for illuminating object 418. For example, the single radiation source may be a broadband radiation source configured to generate a broadband beam of radiation. One or more wavelengths filters are used to spectrally filter the broadband beam of radiation to obtain first beam of radiation and second beam of radiation having different wavelength.

In some embodiments, enclosure 412 may include additional viewport windows. For example, first beam of radiation and second beam of radiation may illuminate object 418 via separate viewport windows.

In one example, the first wavelength may be in the visible spectrum and the second wavelength may be in the infrared spectrum.

In one example, the first wavelength and the second wavelength may be in the visible spectrum.

In some embodiments, the detection system 404 may comprise a sensor element 428 and a focusing element 430 (e.g., an objective lens or lens system). Sensor element 428 may capture an image of the object at different wavelengths. Detection system 404 may be an image capture device or a multi-cell photo-detector (e.g., two dimensional array of photo-detectors, camera). Sensor element 428 may comprise a charge-coupled device (CCD) or a complementary metal-oxide-semiconductor (CMOS). In some embodiments sensor elements may include multiple sensor elements, each sensor element being configured to capture an image at a particular wavelength. In some embodiments, detection system 404 may be a single-cell photo-detector (without more, may not be able to resolve an image), in which case sensor element 428 may be a photo-sensitive diode. However, a single-cell photo-detector may be desirable in instances where size, ease of assembly, and/or cost-efficiency are appreciable factors. In one example, an area of interest on surface 424 of object 418 may be scanned. The detection system 404 may have a detection range from ultraviolet to near infrared. In some embodiments, detection system 404 may have a detection range in the visible spectrum.

In some embodiments, the detection system 404 may receive radiation, represented by detected radiation 432, scattered at surface 424 and by structures near the surface (e.g., pattern features 420). Detected radiation 432 scattered at surface 424 may include radiation scattered by particle 422 that is disposed on surface 424. Detection system 404 may generate a detection signal based on the received radiation. The detection signal may comprise information of the received radiation, for example, intensity, phases, and the like. The detection signal may include data of the detected image.

Processor 406 may receive and analyze the detection signal. Processor 406 may determine a size of particle 422 on surface 424, edges of particle 422, and/or a material composition of particle 422 (e.g., carbon, biological, steel, aluminum). Further, processor 406 may distinguish between a spurious signal and a signal corresponding to a presence of particle 422 on surface 424 as described further below.

In the context of detection of radiation, the terms "false," "spurious," "ghost," "parasitic," and the like may be used to describe signals associated with radiation that does not interact with a foreign particle.

In some embodiments, the determination performed by processor 406 may comprise determining a type of contamination of a potential presence of particle 422. Processor 406 may present detection results to a user of particle inspection system 400 (e.g., on a computer display).

Although specific embodiments have been described in the context of detecting foreign particles (e.g., particle 422), the embodiments described herein are not limited to particulate contamination detection. In some embodiments, the particle inspection systems described herein may detect imperfections in general such as scratches, holes, or recesses, foreign particles, stains, and the like. It is desirable to detect all types of imperfections that pose a risk of disrupting lithographic processes.

In some embodiments, processor 406 identifies edges of objects/particles using at least two images acquired in dissimilar spectral bands. For an optical system working in fixed conjugates and numerical aperture F/#, a change of imaging wavelength results in change of resolution and consequently proportional change of objects size proportional to change of diameter of the Airy disk. Intensity difference between images acquired at dissimilar wavelengths is theoretically predicted and is used to find objects edges. In the systems described herein, size difference between objects is directly proportional to spectral separation between images. The size difference is a function of spectral properties of radiation source and detection system.

In some embodiments, particle inspection system 400 is chromatically corrected (NA independent). A series of spectrally separated images acquired by detection system 404 is used in order to isolate a target object from background. Since resolution and imaging system is wavelength dependent and typically for systems with fixed NA, F/# decreases with increase of wavelength. Image of an object given by non-coherent observation system is given as convolution of input with system's impulse response (Airy disk). Airy disk diameter is given by well-known equation $\varphi=1.22\lambda/NA$ and is affected by both numerical aperture (NA) and wavelength ($\lambda$), thus images acquired at shorter wavelength have a higher resolution than images acquired at longer wavelength (s). Change of wavelength results in lateral shift full width half maxima border (FWHD) encapsulating objects intensity distribution due to change of resolution. Change of size of an arbitrary object can be measured using set of at least two images acquired at dissimilar wavelengths or using optical system operating at dissimilar numerical apertures. Knowing ratio of resolutions between at least two images one can numerically reconstruct target object border. This in turn allow identification and sizing of target objects based on difference between intensity distribution in images acquired at dissimilar wavelengths.

In one example, the detection system 404 has a NA=0.1, magnification of −1× and the sensor element 428 (or imaging detector) has 3.5 μm square pixels. Images are sequentially acquired at two wavelengths of $\lambda_1$=450 nm and $\lambda_2$=650 nm. Airy disk diameter for the case is $\phi_{\lambda_1}$=1.22×650/0.1=5.49 μm and for the second spectral channel, the airy disk diameter is $\phi_{\lambda_2}$=1.22×650/0.1==7.93 μm. Difference in diameter of Airy disk between the inspection system operating at $\lambda_1$ and $\lambda_2$ is $\phi_{\lambda_1}-\phi_{\lambda_2}$=2.44 μm. Change of Airy disk diameter is comparable with size of image detector pixel.

Figure 5:
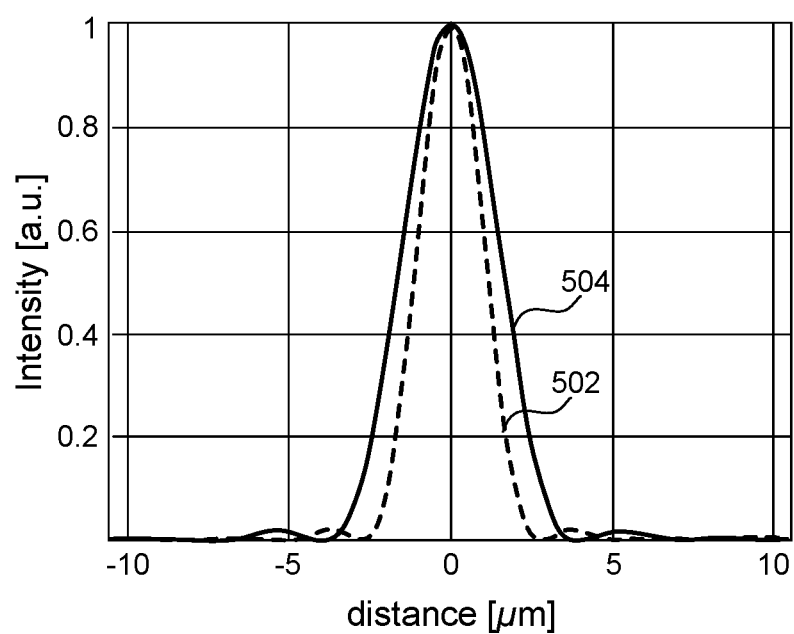
FIG. 5 shows intensities of a cross-section through an Airy disk at a first wavelength and a second wavelength, according to some embodiments.

FIG. 5 shows intensities of a cross-section through an Airy disk at a first wavelength and a second wavelength, according to some embodiments. Graph 502 illustrates a cross-section of the intensity distribution at $\lambda_1$=450 nm and Graph 504 illustrates a cross section of the intensity distribution at $\lambda_2$=650 nm. Diameter of the Airy disk corresponds to a resolution of detection system 404.

Figure 6:
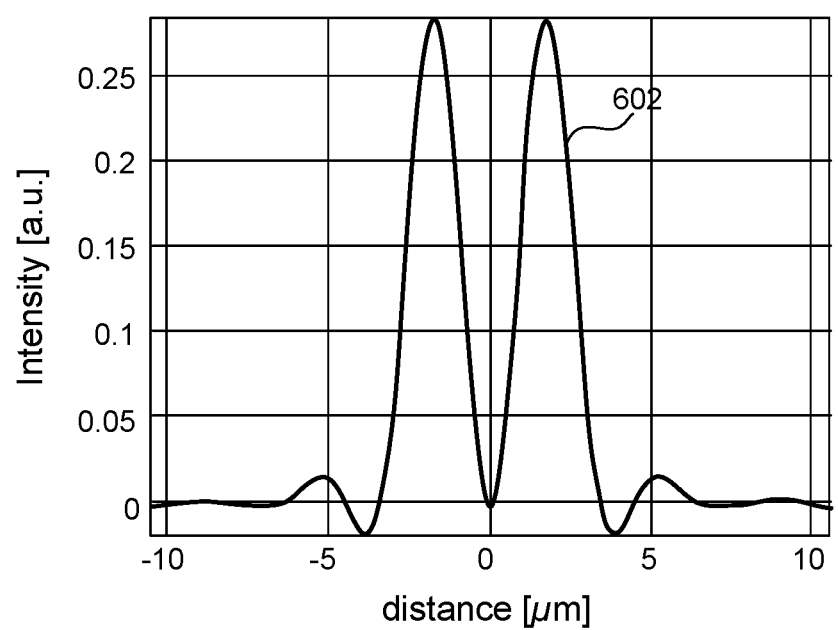
FIG. 6 shows a difference between the intensities at the first wavelength and at the second wavelength, according to some embodiments.

FIG. 6 shows a difference between the intensities at the first wavelength and at the second wavelength, according to some embodiments. Graph 602 a difference between the intensities at $\lambda_1$=450 nm and $\lambda_2$=650 nm shown by graph 502 and graph 504 of FIG. 5.

EXAMPLE

Figure 7:
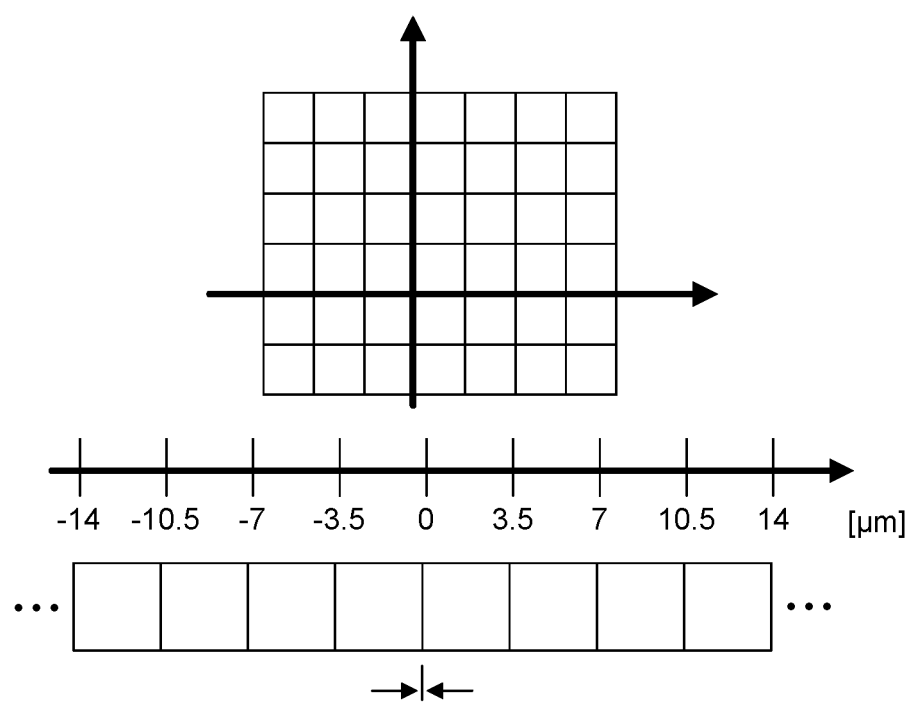
FIG. 7 shows an exemplary pixel grid with a center of the Airy disk, according to some embodiments.
Figure 8A:
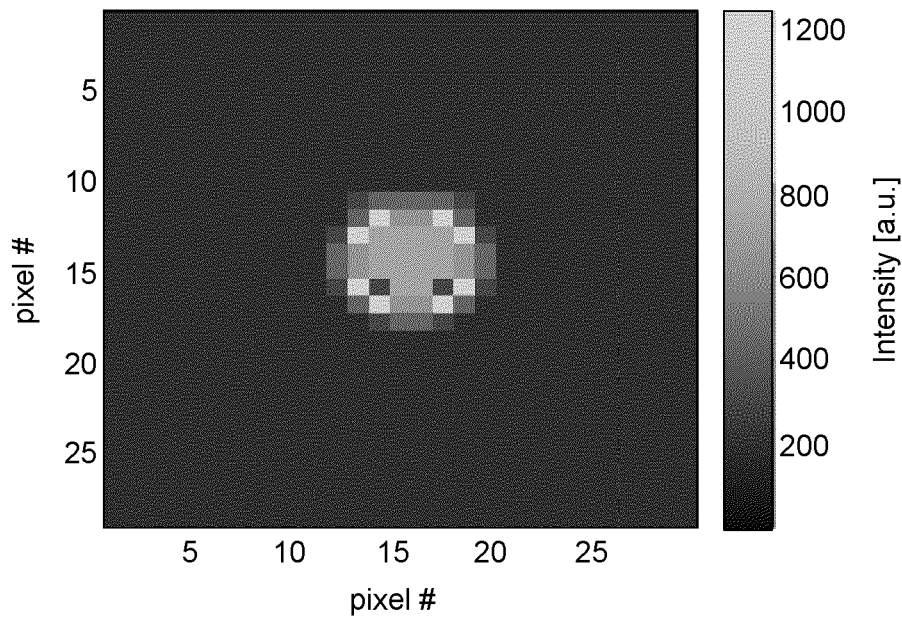
FIG. 8A shows an image of a particle at the first wavelength, according to some embodiments.
Figure 8B:
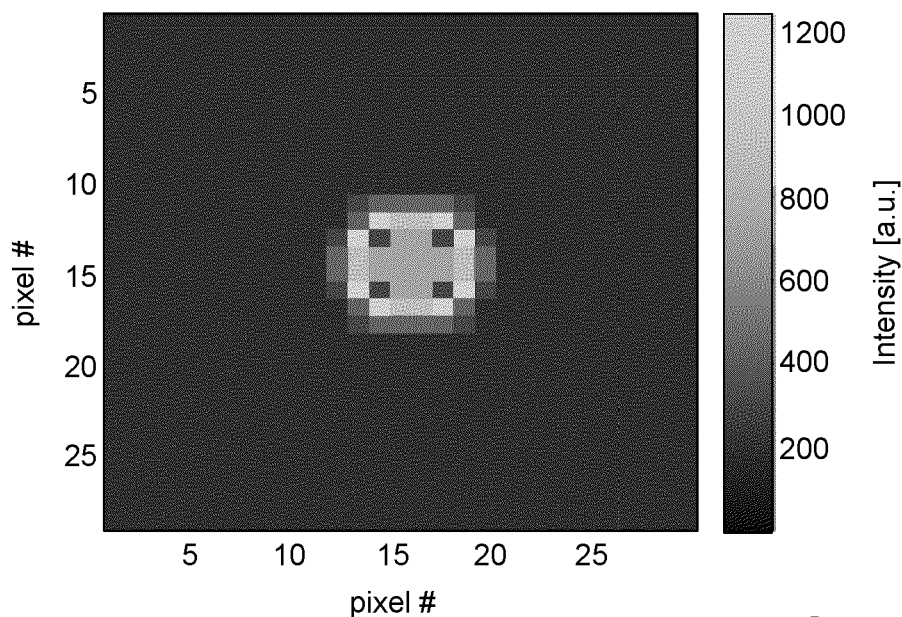
FIG. 8B shows an image of a particle at the second wavelength, according to some embodiments.

Simulated images of a disk shaped object having a 10 μm diameter imaged by the inspection system 400 operating at $\lambda_1$=450 nm and $\lambda_2$=650 nm are shown in FIGS. 8A and 8B, respectively. The inspection system has a diffraction limited optical system having a NA=0.1. Sensor element 428 (or imaging detector) has 3.5 μm square pixels. FIG. 7 depicts camera pixel organization in reference to coordinate system of simulated intensity distribution. The center of the particle is at an edge of the camera pixel.

Figure 9:
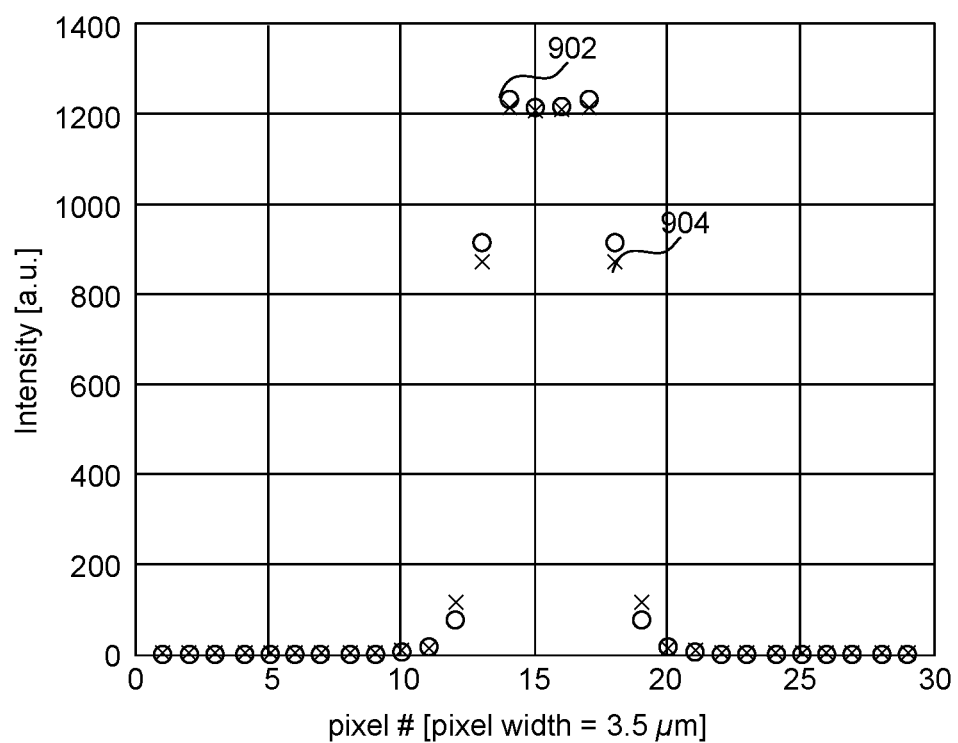
FIG. 9 shows a cross section of the images of the particle at the first wavelength and at the second wavelength, according to some embodiments.

FIG. 9 shows a cross section of the images of the particle at the first wavelength and at the second wavelength, according to some embodiments. Graph 902 shows a horizontal cross-section through central row of FIG. 8A. Graph 904 shows a horizontal cross-section through central row of FIG. 8B.

Figure 10A:
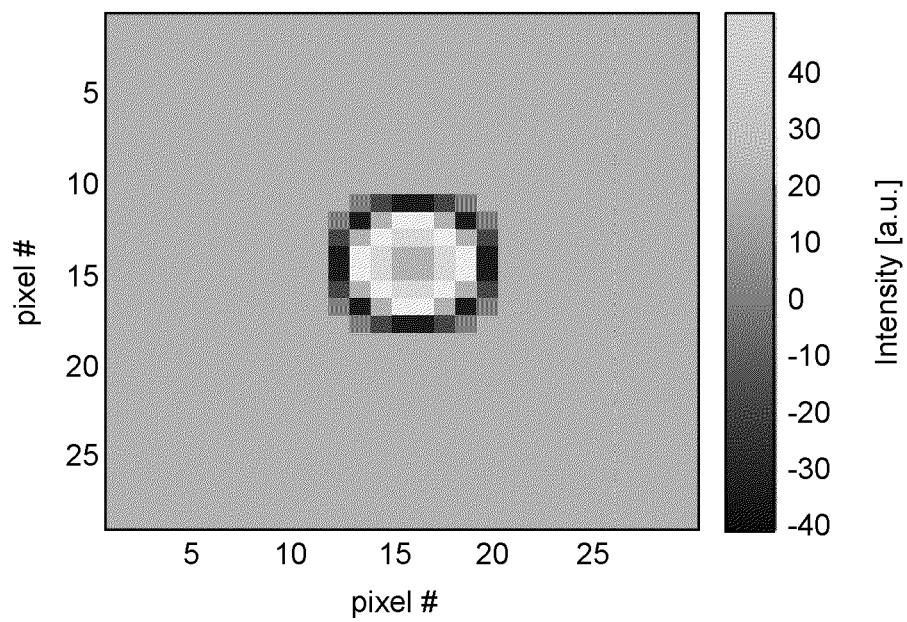
FIG. 10A shows a difference between a first image of a particle at a first wavelength and a second image of the particle at the second wavelength, according to some embodiments.

FIG. 10A shows a difference between a first image of a particle at a first wavelength and a second image of the particle at the second wavelength, according to some embodiments.

Figure 10B:
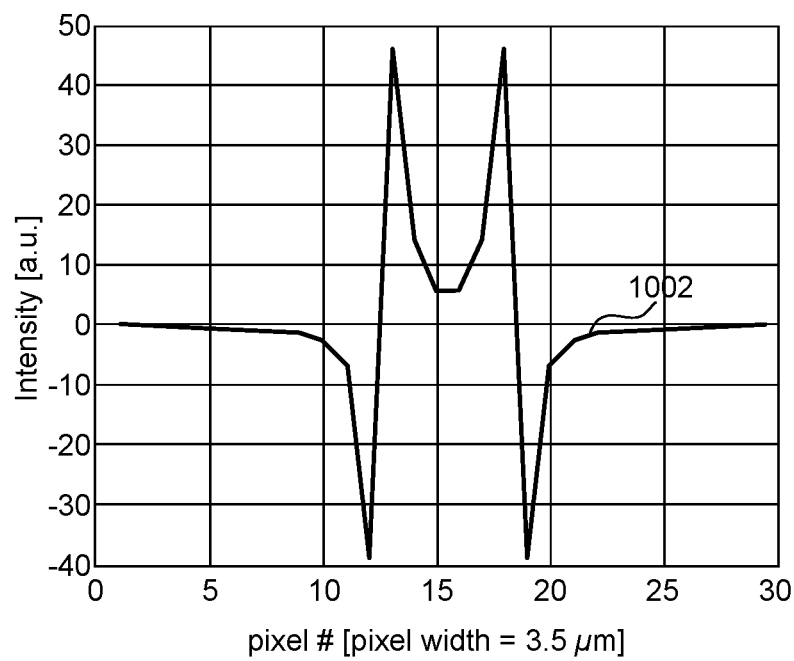
FIG. 10B shows a cross section of the image of FIG. 10A, according to some embodiments.

FIG. 10B shows a cross section of the image of FIG. 10A, according to some embodiments. Graph 1002 shows a horizontal cross-section through central row of FIG. 10A.

Example 2

Figure 11:
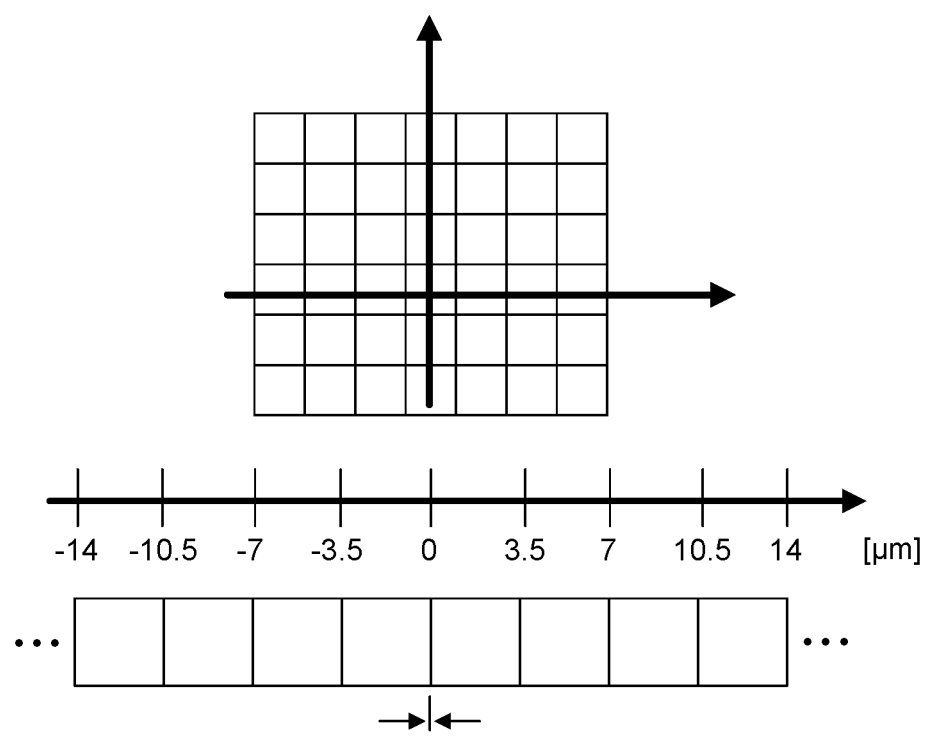
FIG. 11 shows an exemplary pixel grid with a center of the Airy disk at a middle of a pixel, according to some embodiments.
Figure 12A:
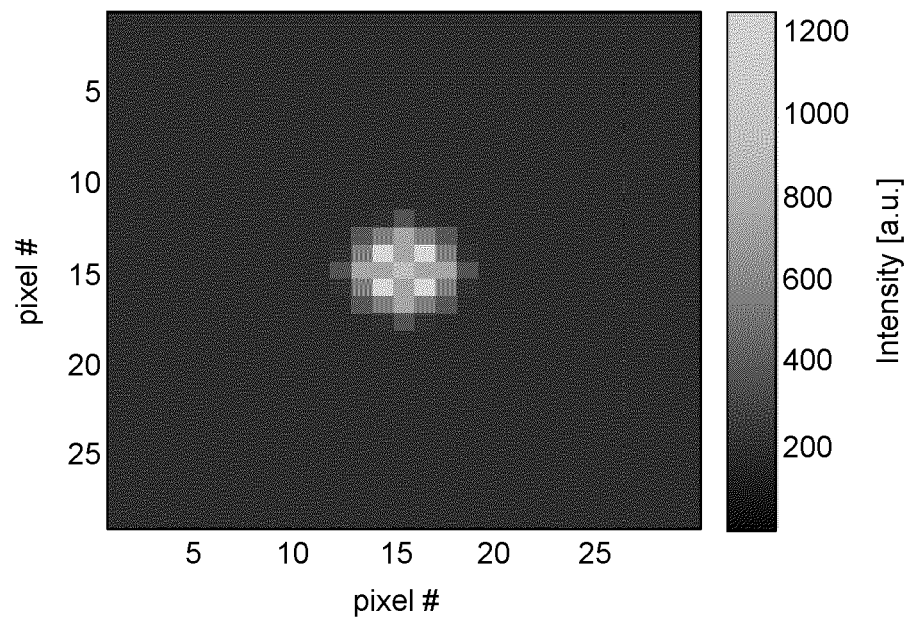
FIG. 12A shows an image of a particle at the first wavelength, according to some embodiments.
Figure 12B:
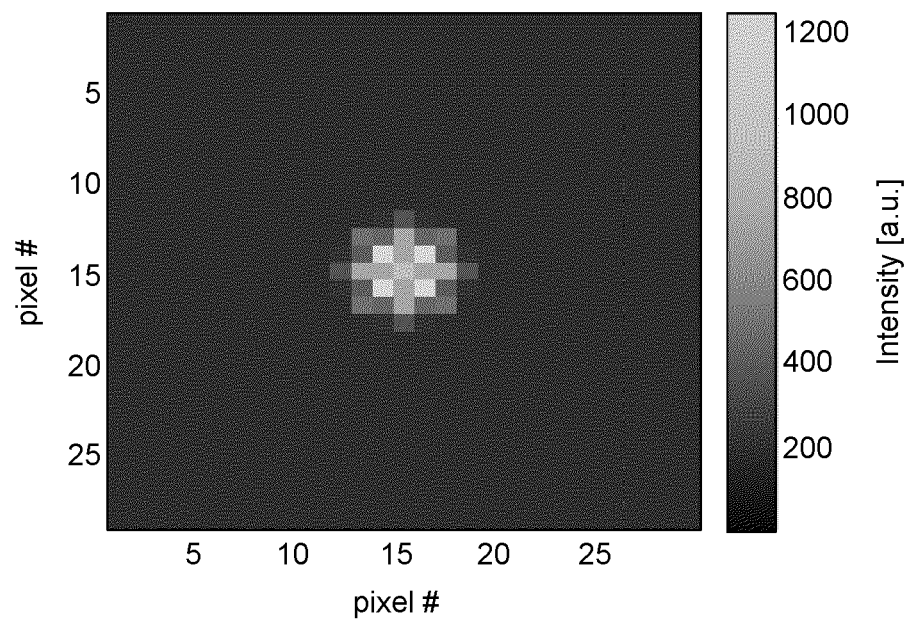
FIG. 12B shows an image of a particle at the second wavelength, according to some embodiments.

Simulated images of a disk shaped object having a 10 μm diameter imaged by the inspection system 400 operating at $\lambda_1$=450 nm and $\lambda_2$=650 nm are shown in FIGS. 12A and 12B. The inspection system has a diffraction limited optical system having a NA=0.1. Sensor element 428 (or imaging detector) has 3.5 μm square pixels. FIG. 11 depicts camera pixel organization in reference to a coordinate system of simulated intensity distribution. A center of particle corresponds to a center of the pixel of the sensor element 428.

Figure 13:
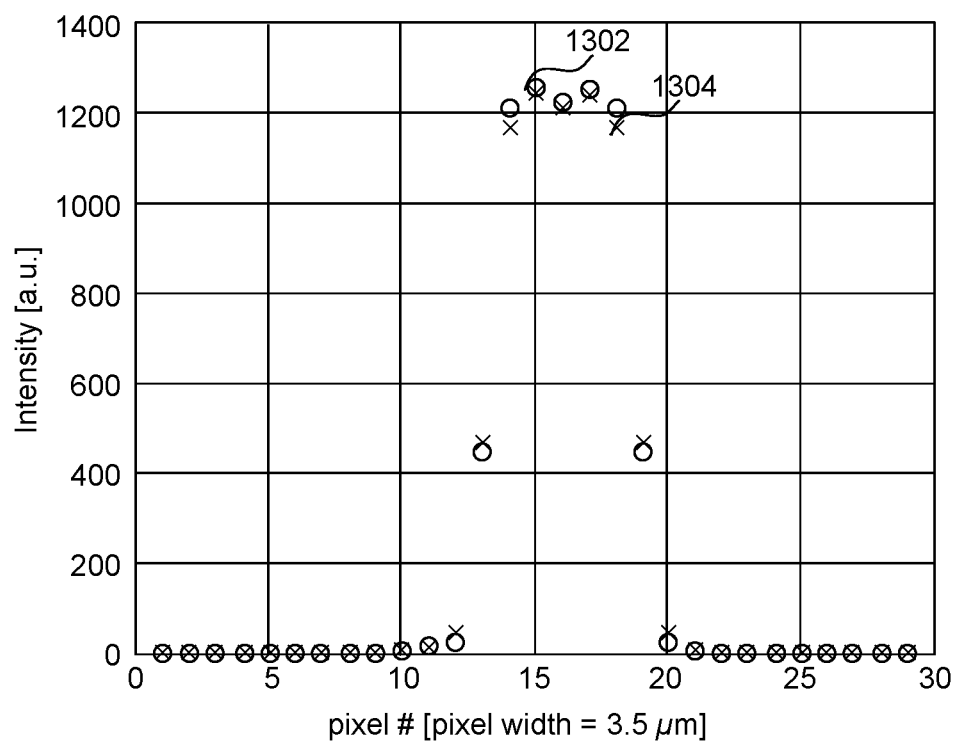
FIG. 13 shows a cross section of the images of the particle at the first wavelength and at the second wavelength, according to some embodiments.

FIG. 13 shows a cross section of the images of the particle at the first wavelength and at the second wavelength, according to some embodiments. Graph 1302 shows a horizontal cross-section through central row of FIG. 12A. Graph 1304 shows a horizontal cross-section through central row of FIG. 12B.

Figure 14A:
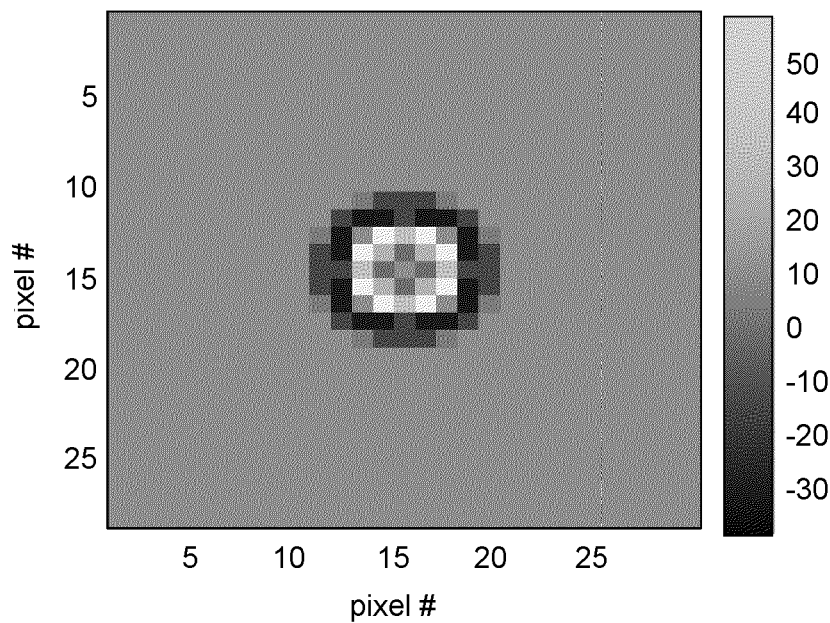
FIG. 14A shows a difference between a first image of a particle at a first wavelength and a second image of the particle at the second wavelength, according to some embodiments.

FIG. 14A shows a difference between a first image of a particle at a first wavelength and a second image of the particle at the second wavelength, according to some embodiments.

Figure 14B:
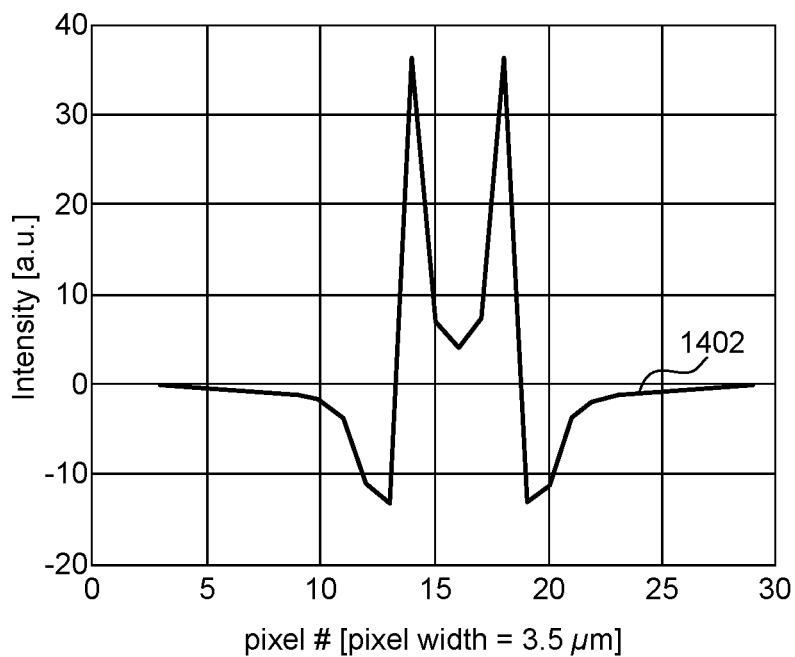
FIG. 14B shows a cross section of the image of FIG. 14A, according to some embodiments.

FIG. 14B shows a cross section of the image of FIG. 14A, according to some embodiments. Graph 1402 shows a horizontal cross-section through central row of FIG. 14A.

Processor 406 may identify edges of an object in acquired images. Processor 406 acquires from the detection system 404 at least two images at first wavelength and second wavelength. Processor 406 determines a difference image corresponding to a difference in intensity between first image at first wavelength and second image at second wavelength (e.g., images shown in FIG. 10A and FIG. 14A). Then, processor 406 identifies edges of the object based on the difference image. For example, difference image may be obtained by performing a subtraction operation between the two images.

In some embodiments, processor 406 may identify edges of an object in acquired images. Processor 406 acquires from the detection system 404 at least two images acquired at two different numerical apertures (NA). Processor 406 determines a difference image corresponding to a difference in intensity between first image at first numerical aperture and second image at second numerical aperture. Then, processor 406 identifies edges of the object based on the difference image.

In some embodiments, identifying edges of the objects may comprise identifying locations where intensity I(x,y) crosses zero intensity in the difference image or in the first and second images based on the following parameters minimum negative value, minimum positive value, distance at orientation at which intensities values are tested, difference between tested positive and negative intensity, and the like. Processor 406 may connect disconnected edge points based on distance. Processor 406 may compare a change of intensity with theoretically predicted value (template matching) or experimentally verified value to identify edges and distinguish them from false positive. For example, object 418 includes diffractive patterns 420 that may cause false positives. Processor 406 may enable identification of false positive detection(s) emerging from diffractive properties of reticle patterns based on the differential intensity signal. Since ghost reflections location is governed by grating equation and object edge location is governed by properties of imaging system, the probability that both will move/shift identically in images acquired at $\lambda_1$ and $\lambda_2$ is low.

In one embodiment, processor 406 may distinguish between particle 422 and a ghost signal based on the difference in intensity between the two images. A small difference in intensities may correspond to a ghost signal. Processor 406 may compare the difference in intensities to a preset threshold to determine whether a particle is present on the surface of the object.

In one aspect, an analogous mechanism is responsible for false positives when inspecting a pellicle front side (in that case light instead of traveling in glass would travel through air gap between reticle pattern and pellicle).

In some embodiments, the first wavelength and the second wavelength corresponds to the edges of quantum efficiency of the detection system. This provides the advantage of maximizing target size change between the first image acquired at the first wavelength and the second image acquired at the second wavelength.

In one example, each pixel of the first image and the second image is analyzed individually for change of intensity. That is, the system described herein is robust to non-even illumination and to the reflectivity of target objects.

In some embodiments, particle inspection system 400 may determine a material composition of particle 422. Radiation source 408 may be a laser source configured to radiate at two or more wavelengths.

In some embodiments, detection system may acquire two images of the particle 422 at a single wavelength using imaging system having a different numerical aperture. For example, detection system 404 may represent two or more detection systems 404 having dissimilar numerical aperture. Illumination system 402 illuminates particle 422 using a single illumination beam. The two or more detection systems 404 capture at least two images of particle 422. Processor 406 analyzes detection signal representing data from the at least two images of particle 422 to determine edges of particle 422. In other words, the detection system may acquire two images of particle 422 at different resolution and determine edges of the particle 422 based on a difference in intensity of the two images.

In some embodiments, processor 406 may compare sizing data determined using particle inspection system 400 with sizing data acquired using another system such as an optical microscope. Processor 406 determines a trend based on the comparison. Variations in size that have consistent patterns (higher or lower sizes from inspection system 400 compared to a higher precision equipment) is indicative of a material type, such as higher reflective metallic or lower reflective organics.

FIG. 15 shows exemplary reflections from different particle types, according to some embodiments. A first particle 1502 formed from a low refractive index material reflects/scatters more light than a second particle 1504 formed from a high refractive index material.

Figure 16:
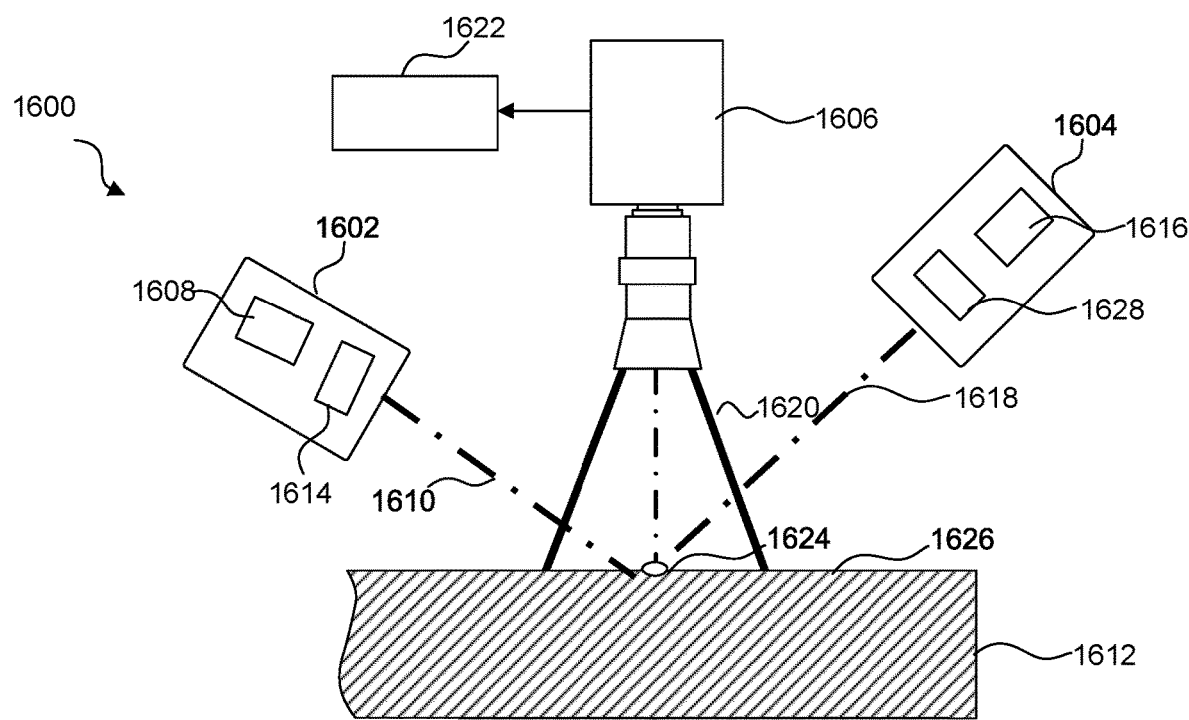
FIG. 16 shows a schematic of a particle inspection system, according to some embodiments.

FIG. 16 shows a schematic of a particle inspection system 1600, according to some embodiments. Particle inspection system 1600 includes a first illumination system 1602, a second illumination system 1604, and a detection system 1606. First illumination system 1602 may comprise a first radiation source 1608. In some embodiments, radiation source 1608 may generate a first beam of radiation 1610 to illuminate object 1612 at a first wavelength. First illumination system 1602 may comprise one or more radiation adjusting elements 1614 (e.g., any of polarizers, wavelength filters, focusing elements, beam splitters, beam combiners, and the like). Second illumination system 1604 may comprise a second radiation source 1616. Second illumination system 1604 may comprise one or more radiation adjusting elements 1628. Second radiation source 1616 generates a second beam of radiation 1618 to illuminate object 1612 at a second wavelength simultaneously with the first beam of radiation 1610. A particle 1624 may be present on surface 1626 of object 1612.

In one embodiment, the first wavelength in the visible spectrum and the second wavelength is in the infrared spectrum. The first wavelength may be about 532 nm. First radiation beam 1610 and second radiation beam 1618 drive the thermal behavior of particles. In particular, a coefficient of thermal expansion of the particle changes due to the illumination by the second beam of radiation 1618. That is, optical response of the particle change due to the infrared exposure.

Detection system 1606 directs the scattered radiation 1620 to one or more sensing elements. Detection system 1606 is configured to generate a detection signal based on scattered radiation 1620 at first wavelength.

Particle inspection system 1600 may also comprise processor 1622. Processor 1622 may output a material composition to a user via an interface. Processor 1622 may determine the material composition based on the detected Mie scattering.

Further, processor 1622 may output a corrective action warning based on the material composition. For example, in response to determining that the material composition or type is organic, a warning to the users is output. In response to determining that the material composition is metallic, a warning to check the system is output. The corrective action warning may also include recalibration data of the sizing algorithm based on historical data of material composition of the inspected samples.

In one embodiment, particle inspection system 1600 may include a third illumination system (not shown) configured to generate a third beam of radiation having a third wavelength in the visible spectrum. The detection system may acquire images of the object at the first wavelength and at the third wavelength.

In one embodiment, first illumination system 1602 may have a tunable radiation source configured to be tuned between two wavelengths in the visible spectrum. The detection system may acquire images of the object at the two wavelengths. Processor 1622 may analyze the images to determine edges of particle as described previously herein.

In one embodiment, the object 1612 is a reticle and the particle inspection system is integrated in a deep ultraviolet (DUV) lithography system or an extreme ultraviolet (EUV) lithography system.

Figure 17:
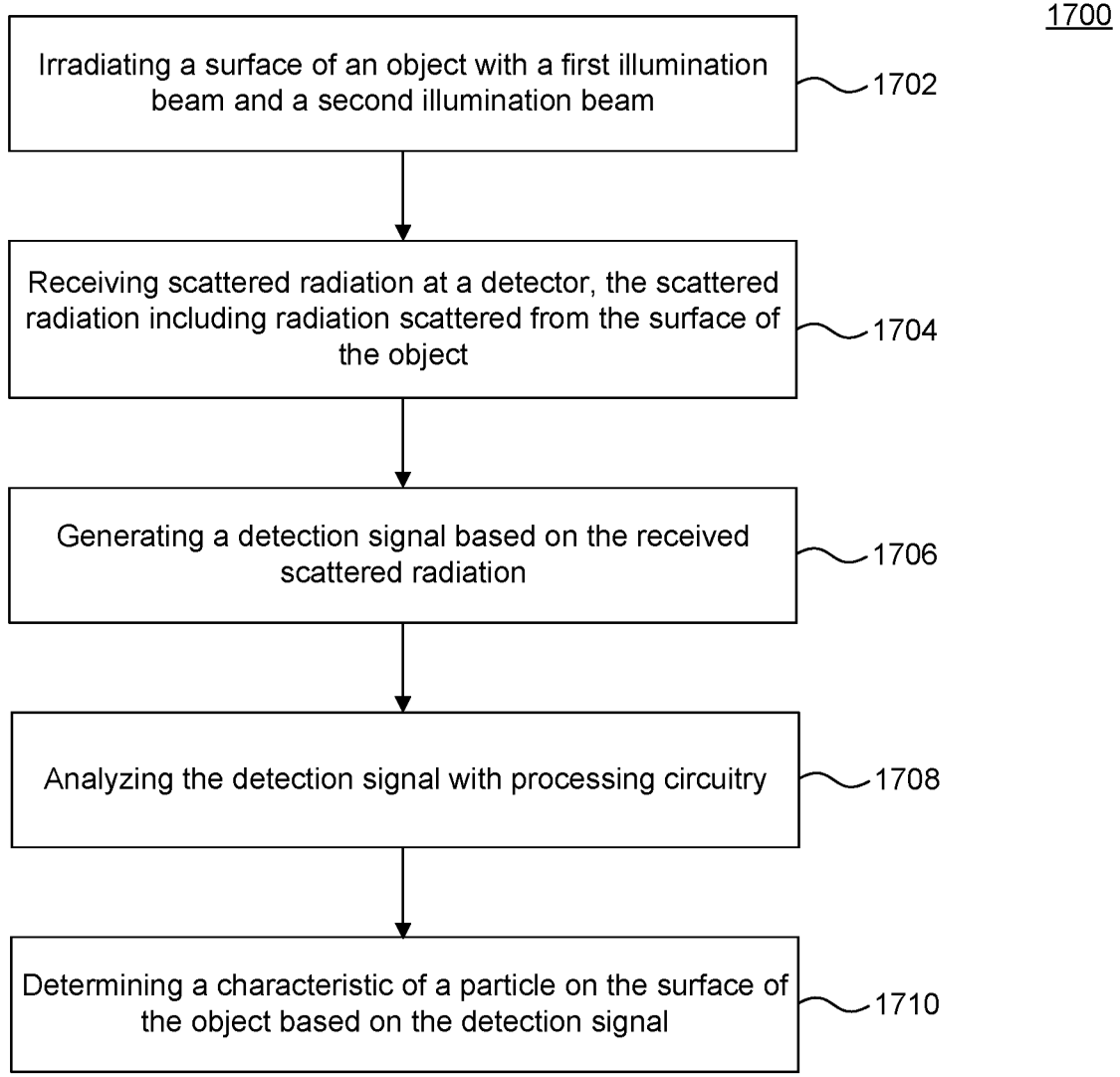
FIG. 17 shows a flow diagram of an inspection method, according to some embodiments.

FIG. 17 shows a flow diagram of an inspection method 1700, according to some embodiments. It should be understood that the operations shown in method 1700 are not exhaustive and that other operations can be performed as well before, after, or between any of the illustrated operations. In various embodiments of the present disclosure, the operations of method 1700 can be performed in a different order and/or with different devices than those described as exemplary.

Operation 1702 includes irradiating a surface of an object simultaneously with a first illumination beam at a first wavelength and a second illumination beam at a second wavelength (e.g., beam of radiation 426 generated by radiation source 408). The first wavelength is different from the second wavelength. For example, the surface of the object may be a back side of lithographic patterning device or reticle 418 of FIG. 4.

Operation 1704 includes receiving scattered radiation by a particle present at the surface of the object at the first wavelength at a detector. This may be receiving scattered light scattered by particles or contaminants found on the back side of lithographic patterning device or object 418 of FIG. 4.

Operation 1706 includes generating a detection signal based on the received scattered radiation at a detection system (e.g., detection system 404 of FIG. 4). In some embodiments, operation 1706 can include detecting inelastic optical scattering to determine molecular composition of the particle.

Operation 1708 includes analyzing the detection signal with processing circuitry (e.g. processor 406 of particle inspection system 400 of FIG. 4).

Operation 1710 includes determining a characteristic of the particle based on the detection signal.

In some embodiments, the first wavelength is in the visible spectrum and the second wavelength is in the infrared spectrum.

In some embodiments, there can be an acquiring operation to acquire sizing data corresponding to the particle from a second inspection system. Further, there can be a comparing operation to compare the acquired sizing data with the size of the object. An identifying operation identifies a trend based on the comparing operation. There can be a determining operation of a material type of the particle based on the identified trend.

In some embodiments, there can be an outputting operation of a corrective action warning based on the determination.

In some embodiments, there can be an analyzing operation of a photothermal modulation of Rayleigh scattering (e.g., Mie scattering) of the detection signal at the first wavelength. Further, there can be a determining operation of a material type of the particle based on the analysis.

In some embodiments, the first wavelength and the second wavelength are in the visible spectrum.

In some embodiments, the detection system includes an image capture device, and the detection signal represents image data.

In some embodiments, first image acquired at first wavelength and second image acquired at second wavelength are used to identify target objects by analyzing spatial and spectral information encoded in the first image and the second image.

In some embodiments, metrology systems described herein may be implemented in a larger system, for example, within a lithographic apparatus.

The embodiments may further be described using the following clauses:

1. An inspection system comprising:
   an illumination system configured to generate a first illumination beam at a first wavelength and a second illumination beam at a second wavelength, the first wavelength being different from the second wavelength, and to irradiate an object simultaneously with the first illumination beam and the second illumination beam;
   a detection system configured to receive radiation scattered by a particle present at a surface of the object at the first wavelength and to generate a detection signal; and
   processing circuitry configured to determine a characteristic of the particle based on the detection signal.
2. The inspection system of clause 1, wherein the first wavelength is in the visible spectrum and the second wavelength is in the infrared spectrum.
3. The inspection system of clause 2, wherein:
   the characteristic is a size of the particle, and
   the processing circuitry is further configured to:
   acquire sizing data corresponding to the particle from a second inspection system;
   compare the acquired sizing data with the size of the particle;
   identify a trend based on the comparison; and
   determine a material type of the particle based on the identified trend.
4. The inspection system of clause 3, wherein the processing circuitry is further configured to output a corrective action warning based on the determination.
5. The inspection system of clause 2, wherein the processing circuitry is further configured to:
   analyze a photothermal modulation of Rayleigh scattering of the detection signal at the first wavelength; and
   determine a material type of the particle based on the analyzing.
6. The inspection system of clause 2, wherein the received radiation includes inelastically scattered light and the processing circuitry is further configured to:
   determine a material type based on the inelastically scattered light.
7. The inspection system of clause 1, wherein the first wavelength and the second wavelength are in the visible spectrum.
8. The inspection system of clause 1, wherein:
   the detection system includes an image capture device, and
   the detection signal represents image data.
9. The inspection system of clause 8, wherein the characteristic is an edge of the particle.
10. The inspection system of clause 9, wherein the processing circuitry is further configured to: acquire a first image based on the detection signal at a first wavelength;
    acquire a second image based on a second detection signal acquired at the second wavelength;
    determine a third image based on the first image and the second image; and
    identify edges of the particle in the third image based on one or more criteria.
11. The inspection system of clause 10, wherein the one or more criteria include a minimum intensity value, a maximum intensity value, and predicted intensity values.
12. The inspection system of clause 9, wherein the processing circuitry is further configured to distinguish between the edge of the particle and ghost reflections location based on a shift in a location in the first image and the second image.
13. The inspection system of clause 9, wherein the detection system has a spectral range from the first wavelength to the second wavelength.
14. An inspection method comprising:
    irradiating an object simultaneously with a first illumination beam at a first wavelength and a second illumination beam at a second wavelength, the first wavelength being different from the second wavelength;
    receiving scattered radiation by a particle present at a surface of the object at the first wavelength;
    generating a detection signal based on the received scattered radiation;
    analyzing the detection signal; and determining a characteristic of the particle based on the detection signal.
15. The inspection method of clause 14, wherein the first wavelength is in the visible spectrum and the second wavelength is in the infrared spectrum.
16. The inspection method of clause 15, wherein:
    the characteristic is a size of the particle; and
    the method further comprising:
    acquiring sizing data corresponding to the particle from a second inspection system,
    comparing the acquired sizing data with the size of the particle,
    identifying a trend based on the comparison, and
    determining a material type of the particle based on the identified trend.
17. The inspection method of clause 16, further comprising:
    outputting a corrective action warning based on the determination.
18. The inspection method of clause 15, further comprising:
    analyzing a photothermal modulation of Mie scattering of the detection signal at the first wavelength; and
    determining a material type of the particle based on the analyzing.
19. The inspection method of clause 14, wherein the first wavelength and the second wavelength are in the visible spectrum.
20. The inspection method of clause 14, wherein:
    the detection system includes an image capture device, and
    the detection signal represents image data.
21. A lithography apparatus comprising:
    an illumination apparatus configured to illuminate a pattern of a patterning device;
    a projection system configured to project an image of the pattern onto a substrate; and
    a metrology system including:
    an illumination system configured to generate a first illumination beam at a first wavelength and a second illumination beam at a second wavelength, the first wavelength being different from the second wavelength, and to irradiate an object simultaneously with the first illumination beam and the second illumination beam,
    a detection system configured to receive radiation scattered by a particle present at a surface of the object at the first wavelength and to generate a detection signal, and processing circuitry configured to determine a characteristic of the particle based on the detection signal.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the present disclosure in the context of optical lithography, it will be appreciated that the present disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the present disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the present disclosure have been described above, it will be appreciated that the present disclosure can be practiced otherwise than as described. The description is not intended to limit the present disclosure.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of protected subject matter should not be limited by any of the above-described exemplary embodiments, but should be defined only in accordance with the following claims and their equivalents.

The invention claimed is:

1. An inspection system comprising:
an illuminator that generates a first illumination beam at a first wavelength and a second illumination beam at a second wavelength, the first wavelength being different from the second wavelength, and irradiates an object simultaneously with the first illumination beam and the second illumination beam;
a detector that receives radiation scattered by a particle present at a surface of the object at the first wavelength and generates a detection signal; and
processing circuitry configured to:
acquire a first image based on a first intensity of the detection signal at the first wavelength;
acquire a second image based on a second intensity of a second detection signal acquired at the second wavelength;
determine a third image by comparing the first intensity and the second intensity;
analyze a photothermal modulation of Mie scattering of the detection signal at the first wavelength; and
determine a material type of the particle based on the analyzing;
wherein the first wavelength is in the visible spectrum and the second wavelength is in the infrared spectrum.

2. The inspection system of claim 1, wherein the processing circuitry is further configured to:
acquire sizing data corresponding to the particle from a second inspection system;
compare the acquired sizing data with a size of the particle based on the third image;
identify a trend based on the comparison; and
determine the material type of the particle based on the identified trend.

3. The inspection system of claim 2, wherein the processing circuitry is further configured to output a corrective action warning based on the determination.

4. The inspection system of claim 1, wherein the processing circuitry is further configured to:
analyze a photothermal modulation of Rayleigh scattering of the detection signal at the first wavelength; and determine the material type of the particle based on the analyzing.

5. The inspection system of claim 1, wherein the received radiation includes inelastically scattered light and the processing circuitry is further configured to:
  determine the material type based on the inelastically scattered light.

6. The inspection system of claim 1, wherein:
  the detection system includes an image capture device, and
  the detection signal represents image data.

7. The inspection system of claim 6, wherein a characteristic is an edge of the particle.

8. The inspection system of claim 7, wherein the processing circuitry is further configured to identify edges of the particle in the third image based on one or more criteria.

9. The inspection system of claim 8, wherein the one or more criteria include a minimum intensity value, a maximum intensity value, and predicted intensity values.

10. The inspection system of claim 7, wherein the processing circuitry is further configured to distinguish between the edge of the particle and a location of a ghost reflection based on a shift in a location in the first image and the second image.

11. The inspection system of claim 7, wherein the detection system has a spectral range from the first wavelength to the second wavelength.

12. An inspection method comprising:
  irradiating an object simultaneously with a first illumination beam at a first wavelength and a second illumination beam at a second wavelength, the first wavelength being different from the second wavelength;
  receiving scattered radiation by a particle present at a surface of the object at the first wavelength;
  generating a detection signal based on the received scattered radiation; analyzing the detection signal; and
  determining a characteristic of the particle based on the detection signal by:
    acquiring a first image based on a first intensity of the detection signal at the first wavelength;
    acquiring a second image based on a second intensity of a second detection signal acquired at the second wavelength;
    determining a third image by comparing the first intensity and the second intensity;
    analyzing a photothermal modulation of Mie scattering of the detection signal at the first wavelength; and
    determining a material type of the particle based on the analyzing;
  wherein the first wavelength is in the visible spectrum and the second wavelength is in the infrared spectrum.

13. The inspection method of claim 12, wherein:
  the characteristic is a size of the particle; and
  the method further comprises:
    acquiring sizing data corresponding to the particle from a second inspection system, comparing the acquired sizing data with the size of the particle,
    identifying a trend based on the comparison, and
    determining the material type of the particle based on the identified trend.

14. The inspection method of claim 13, further comprising:
  outputting a corrective action warning based on the determination.

15. The inspection method of claim 12, wherein:
  the detection system includes an image capture device, and
  the detection signal represents image data.

16. A lithography apparatus comprising:
  a light source that illuminates a pattern of a patterning device;
  a projector that projects an image of the pattern onto a substrate; and
  a metrology system including:
  an illuminator that generates a first illumination beam at a first wavelength and a second illumination beam at a second wavelength, the first wavelength being different from the second wavelength, and irradiates an object simultaneously with the first illumination beam and the second illumination beam,
  a detector that receives radiation scattered by a particle present at a surface of the object at the first wavelength and generates a detection signal, and processing circuitry configured to:
  acquire a first image based on a first intensity of the detection signal at the first wavelength;
  acquire a second image based on a second intensity of a second detection signal acquired at the second wavelength;
  determine a third image by comparing the first intensity and the second intensity;
  analyze a photothermal modulation of Mie scattering of the detection signal at the first wavelength; and
  determine a material type of the particle based on the analyzing;
  wherein the first wavelength is in the visible spectrum and the second wavelength is in the infrared spectrum.

17. The inspection system of claim 1, wherein, in comparing the first intensity and the second intensity, the processing circuitry is configured to perform a subtraction between the first image at the first wavelength and the second image at the second wavelength.

* * * * *

UNITED STATES PATENT AND TRADEMARK OFFICE
CERTIFICATE OF CORRECTION

| | |
|---|---|
| PATENT NO. | : 12,379,655 B2 |
| APPLICATION NO. | : 17/918426 |
| DATED | : August 5, 2025 |
| INVENTOR(S) | : Judge et al. |

Page 1 of 1

It is certified that error appears in the above-identified patent and that said Letters Patent is hereby corrected as shown below:

In the Specification

In Column 14, Line 21, delete "F/#decreases" and replace with --F/# decreases--;

In Column 14, Line 25, delete "$\varphi=1.22\lambda/NA$" and replace with --$\phi=1.22\lambda/NA$--;

In Column 14, Lines 44-45, delete "$\phi_{\lambda 1}=1.22\times650/0.1=5.49$ μm" and replace with --$\phi_{\lambda 1}=1.22\times450/0.1=5.49$ μm--.

Signed and Sealed this
Twenty-third Day of September, 2025

John A. Squires
*Director of the United States Patent and Trademark Office*